(12) United States Patent
Parsa et al.

(10) Patent No.: US 10,409,227 B2
(45) Date of Patent: Sep. 10, 2019

(54) TEMPERATURE GRADIENT IN MICROFABRICATED SENSOR CAVITY

(71) Applicant: Texas Instruments Incorporated, Dallas, TX (US)

(72) Inventors: Roozbeh Parsa, Portola Valley, CA (US); Iouri N Mirgorodski, Sunnyvale, CA (US); William French, San Jose, CA (US); Nathan Brockie, Edinburgh (GB); Ann Gabrys, Woodside, CA (US); Terry Dyer, Largs (GB)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 328 days.

(21) Appl. No.: 15/227,929

(22) Filed: Aug. 3, 2016

(65) Prior Publication Data

US 2018/0038921 A1 Feb. 8, 2018

(51) Int. Cl.
*G04F 5/14* (2006.01)
*G01R 33/00* (2006.01)
*G01R 33/64* (2006.01)

(52) U.S. Cl.
CPC ............ *G04F 5/14* (2013.01); *G01R 33/00* (2013.01); *G01R 33/64* (2013.01)

(58) Field of Classification Search
CPC ......... H02J 1/00; G02B 1/00; G02B 2207/00; H01L 21/00; H01L 2221/00
See application file for complete search history.

(56) References Cited

U.S. PATENT DOCUMENTS

| | | | |
|---|---|---|---|
| 5,446,825 A * | 8/1995 | Moslehi | C23C 16/481 |
| | | | 118/724 |
| 7,292,031 B2 | 11/2007 | Abbink et al. | |
| 7,400,207 B2 | 7/2008 | Lipp et al. | |
| 7,547,358 B1 * | 6/2009 | Shapiro | C30B 9/10 |
| | | | 117/68 |
| 9,319,056 B2 | 4/2016 | Chindo | |
| 9,350,368 B2 | 5/2016 | Maki | |
| 2002/0049389 A1 * | 4/2002 | Abreu | A61B 3/1241 |
| | | | 600/558 |
| 2003/0008308 A1 * | 1/2003 | Enzelberger | B01F 5/102 |
| | | | 435/6.19 |
| 2003/0094953 A1 * | 5/2003 | Brooks | B01J 19/0093 |
| | | | 324/441 |

(Continued)

*Primary Examiner* — Jermele M Hollington
*Assistant Examiner* — Temilade S Rhodes-Vivour
(74) *Attorney, Agent, or Firm* — Andrew R. Ralston; Charles A. Brill; Frank D. Cimino (57) ABSTRACT

A microfabricated sensor includes a sensor cell with a cell body and a window attached to the cell body. A sensor cavity containing sensor fluid material is located in cell body, open to the window. A signal path extends from a signal emitter outside the sensor cell, through the window and sensor cavity, and to a signal detector. The sensor cell may have an asymmetric thermal configuration, conducive to developing a temperature gradient in the sensor cell. One or more heaters are disposed on the sensor cell, possibly in an asymmetric configuration. Power is applied to the heaters, possibly asymmetrically, so as to develop a temperature gradient in the sensor cell with a low temperature region in the sensor cell, sufficient to condense the sensor fluid in the low temperature region, outside of the signal path.

20 Claims, 11 Drawing Sheets

(56) References Cited

U.S. PATENT DOCUMENTS

| | | | |
|---|---|---|---|
| 2006/0051966 A1* | 3/2006 | Or | H01J 37/32082 438/706 |
| 2007/0026421 A1* | 2/2007 | Sundberg | B01L 3/5027 435/6.12 |
| 2011/0228809 A1* | 9/2011 | Tadigadapa | G01K 7/32 374/31 |
| 2015/0244382 A1 | 8/2015 | Ishihara | |
| 2015/0378316 A1 | 12/2015 | Parsa et al. | |

* cited by examiner

TEMPERATURE GRADIENT IN MICROFABRICATED SENSOR CAVITY

FIELD

This disclosure relates to the field of microfabricated sensors. More particularly, this disclosure relates to microfabricated sensor with sensor fluid cavities.

BACKGROUND

A microfabricated sensor, for example a microfabricated atomic clock or a microfabricated atomic magnetometer, has a sensor cell with a sensor cavity containing a sensor fluid such as cesium. A signal path extends into the sensor cell through a window which is part of the sensor cell. The sensor cell has overall dimensions less than 25 millimeters to provide a usable package size, so that the signal path is within a few millimeters of every point in the sensor cavity. During operation of the microfabricated sensor, the sensor cell is heated to convert at least some of the sensor fluid to a vapor phase with a desired vapor pressure. When the microfabricated sensor is turned off, the sensor fluid condenses. A portion of the sensor fluid condenses on the window, in the signal path. When the microfabricated sensor is subsequently turned on, the window remains partially obscured in the signal path due to residue from the condensed sensor fluid. Obscuration of the signal path disadvantageously degrades performance of the microfabricated sensor.

SUMMARY

The following presents a simplified summary in order to provide a basic understanding of one or more aspects of the disclosure. This summary is not an extensive overview of the disclosure, and is neither intended to identify key or critical elements of the disclosure, nor to delineate the scope thereof. Rather, the primary purpose of the summary is to present some concepts of the disclosure in a simplified form as a prelude to a more detailed description that is presented later.

A microfabricated sensor includes a sensor cell with a cell body and at least one window attached to the cell body. A sensor cavity containing sensor fluid material is at least partially bounded by the cell body and the window. A signal path extends into the sensor cavity through the window. In one disclosed version of the microfabricated sensor, one or more heaters are disposed on the sensor cell in an asymmetric configuration. Power is applied to the heaters so as to develop a temperature gradient in the sensor cell with a low temperature region in the sensor cell, outside of the signal path, sufficient to condense the sensor fluid in the low temperature region. In another disclosed version of the microfabricated sensor, at least two heaters are disposed on the sensor cell. Power is asymmetrically applied to the heaters so as to develop a temperature gradient in the sensor cell with a low temperature region in the sensor cavity, outside of the signal path, sufficient to condense the sensor fluid in the low temperature region.

DETAILED DESCRIPTION

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. One skilled in the relevant art, however, will readily recognize that the disclosure can be practiced without one or more of the specific details or with other methods. In other instances, well-known structures or operations are not shown in detail to avoid obscuring the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

A microfabricated sensor includes a sensor cell, a signal emitter and a signal detector. The sensor cell includes a cell body and at least one window attached to the cell body. A second window may be attached to the cell body, opposite from the first window. A sensor cavity containing sensor fluid material is at least partially bounded by the cell body and the windows. A signal path extends from the signal emitter into the sensor cavity through the window and to the signal detector, through the second window if present. During operation of the microfabricated sensor, the sensor cell is heated to convert at least a portion of the sensor fluid to a vapor phase in the sensor cavity. During periods of inoperation, the sensor cell cools and substantially all of the sensor fluid condenses.

In one version of the microfabricated sensor, one or more heaters are disposed on the sensor cell in an asymmetric configuration with respect to the sensor cavity and the cell body. Power is applied to the heaters so as to develop a temperature gradient in the sensor cell with a low temperature region in the sensor cavity, outside of the signal path, sufficient to condense the sensor fluid in the low temperature region.

In another version of the microfabricated sensor, at least two heaters are disposed on the sensor cell. The heaters may have a symmetric configuration with respect to the sensor cavity and the cell body, or may have an asymmetric configuration. Power is asymmetrically applied to the heaters so as to develop a temperature gradient in the sensor cell with a low temperature region in the sensor cavity, outside of the signal path, sufficient to condense the sensor fluid in the low temperature region. The temperature gradient may be developed during a startup phase, during a sensing phase operation period, and/or during a shutdown period.

The examples disclosed herein each describe a sensor cell with a first window attached to a cell body and a second window attached to the cell body opposite from the first window. A sensor cavity is located between the first window and the second window, in an opening in the cell body. A signal path extends through the first window, through the sensor cavity and through the second window. Other configurations of sensor cells, having only one window or more than two windows, are within the scope of the instant disclosure.

Figure 1:
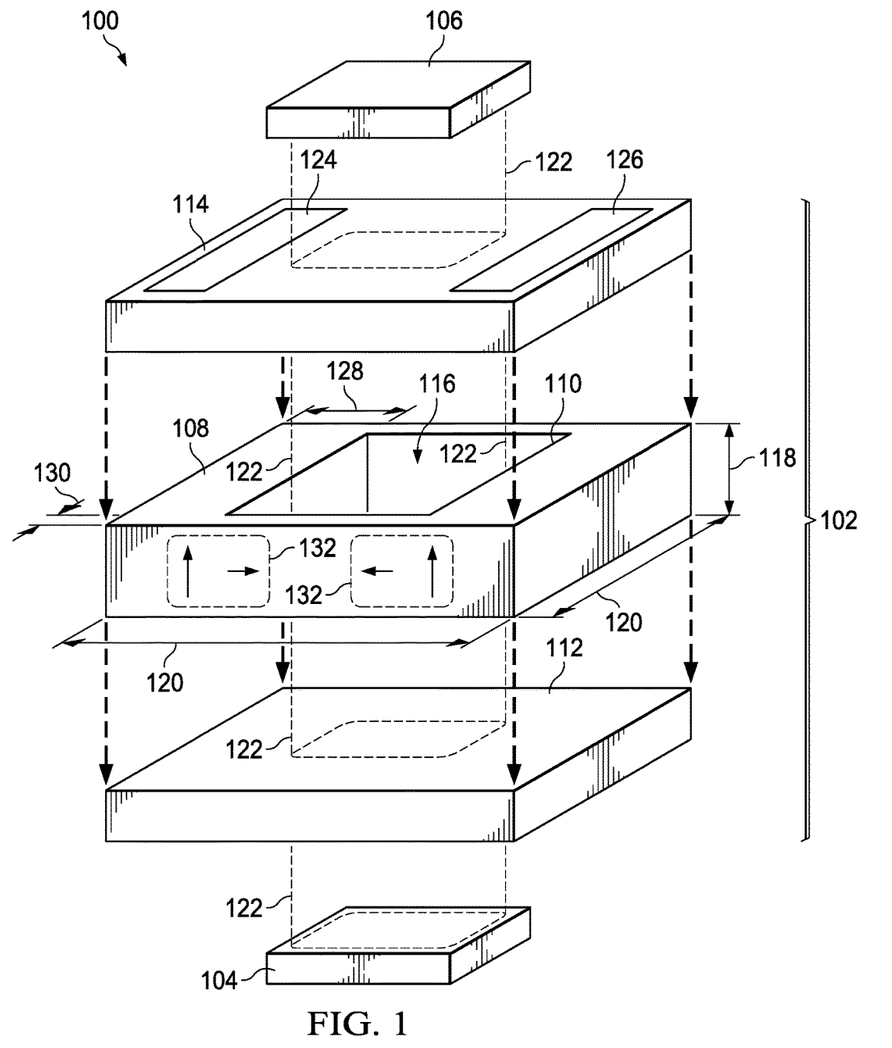
FIG. 1 is an exploded view of an example microfabricated sensor.

FIG. 1 is an exploded view of an example microfabricated sensor. The microfabricated sensor 100 includes a sensor cell 102, a signal emitter 104 disposed outside the sensor cell 102, and a signal detector 106 disposed outside the sensor cell 102, opposite from the signal emitter 104. The signal emitter 104 may be, for example, a visible light source such as a vertical cavity surface emitting laser (VCSEL). The signal detector 106 may be, for example, a silicon photodiode. The microfabricated sensor 100 may be, for example a microfabricated atomic clock (MFAC) or a microfabricated atomic magnetometer (MFAM).

The sensor cell 102 includes a cell body 108 with an opening 110 through the cell body 108. A first window 112 of the sensor cell 102 is attached to the cell body 108 across the opening 110, on a side of the cell body 108 facing the signal emitter 104. A second window 114 of the sensor cell 102 is attached to the cell body 108 across the opening 110, on a side of the cell body 108 opposite from the first window 112, facing the signal detector 106. The opening 110 through the cell body 108 defines a sensor cavity 116 which is bounded by the first window 112 and the second window 114. Due to the integrated structure of the sensor cell 102, a thickness 118 of the cell body 108 between the first window 112 and the second window 114 is less than 10 millimeters and may be 1 millimeter to 2 millimeters, advantageously providing a desired balance between ease of fabrication of the cell body 108 and sufficient volume in the sensor cavity 116 to provide a desired level of performance of the microfabricated sensor 100. Similarly, lateral dimensions 120 of the cell body 108, that is, dimensions parallel to the first window 112 and the second window 114, are less than 20 millimeters and may be 8 millimeters to 15 millimeters.

Sensor fluid material, not shown in FIG. 1, may be disposed in the sensor cavity 116. The term sensor fluid material includes both sensor fluid itself, and the sensor fluid combined with another material that facilitates fabrication of the microfabricated sensor 100. For example, manifestations of the microfabricated sensor 100 as an MFAC or an MFAM may use an alkali metal such as cesium as the sensor fluid. The cesium may be disposed in the sensor cavity in the form of cesium azide ($CsN_3$) which facilitates attaching the first window 112 and the second window 114 to the cell body 108. After fabrication of the sensor cell 102 is completed, the cesium may be released from the cesium azide by heating. The sensor fluid material may be in a combination of a vapor phase and a condensed phase; relative proportions of the amounts in the vapor phase and the condensed phase depend on temperatures of various portions of the sensor cell 102.

The first window 112 is transmissive to a signal emitted by the signal emitter 104 and the second window 114 is transmissive to a signal detected by the signal detector 106. For example, the first window 112 and the second window 114 may comprise glass, possibly with anti-reflection coatings. The cell body 108 may include silicon or other material appropriate for forming sealing attachments to the first window 112 and the second window 114.

A signal path 122 extends from the signal emitter 104 through the first window 112, through the sensor cavity 116, through the second window 114 and to the signal detector 106. A signal conditioning element may be disposed in the signal path 122, for example a quarter wave rotator plate disposed between the signal emitter 104 and the first window 112.

In the instant example, at least two heating elements, including a first heating element 124 and a second heating element 126 are disposed on the sensor cell 102 on different sides of the sensor cavity 116. The first heating element 124 and the second heating element 126 may be disposed on the second window 114 as depicted in FIG. 1, or may be disposed on the cell body 108 or the first window 112. The first heating element 124 and the second heating element 126 may be arranged symmetrically with respect to the sensor cavity 116, as depicted in FIG. 1. The first heating element 124 and the second heating element 126 may include, for example, thin film metal lines formed on the second window 114. Other structures for the first heating element 124 and the second heating element 126, for example heating tapes adhered to the sensor cell 102, are within the scope of the instant example.

A first lateral wall width 128 of the cell body 108 immediately proximate to the first heating element 124 and the second heating element 126 may be at least twice a second lateral wall width 130 of the cell body 108 between the first heating element 124 and the second heating element 126. The greater width of the first lateral wall width 128 facilitates heat transfer from the first heating element 124 and the second heating element 126 during operation of the microfabricated sensor 100 to advantageously maintain a desired temperature in the sensor cavity 116. The lesser width of the second lateral wall width 130 advantageously reduces heat transfer between the first heating element 124 and the second heating element 126 to facilitate development of a desired temperature gradient in the sensor cell 102, for example when operated as described in reference to FIG. 2A through FIG. 2D. In one version of the instant example, material in the cell body 108 may have a higher thermal conductivity in the vertical direction than in the lateral direction, as indicated in FIG. 1 by magnitudes of thermal conductivity vectors 132, which may further facilitate development of a desired temperature gradient in the sensor cell 102. For example, the higher thermal conductivity in the vertical direction may be accomplished by a diamond film on the cell body 108 which has a high thermal conductivity perpendicular to an interface between the diamond film and the cell body 108, and a lower thermal conductivity parallel to the interface.

Figure 2A:
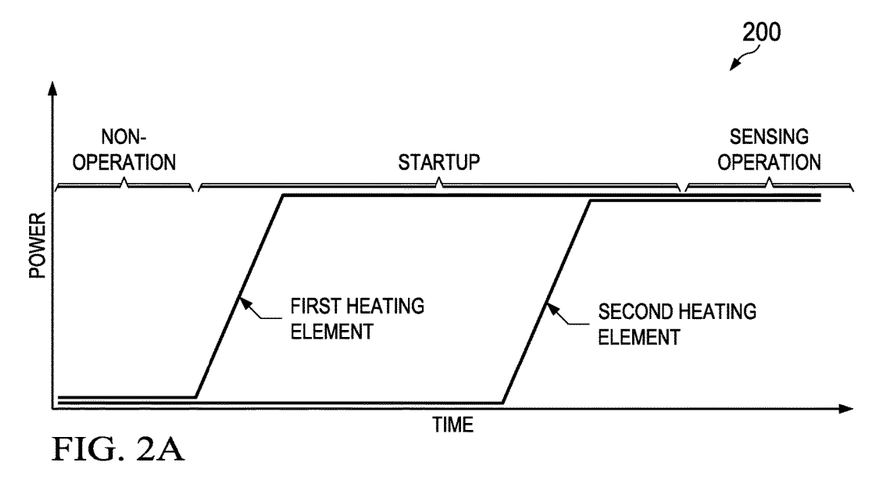
FIG. 2A through FIG. 2D depict example methods of operating a microfabricated sensor such as the microfabricated sensor described in reference to FIG. 1.

FIG. 2A through FIG. 2D depict example methods of operating a microfabricated sensor such as the microfabricated sensor described in reference to FIG. 1. Referring to FIG. 2A, a chart 200 of power applied to a first heating element and a second heating element as a function of time depicts operation of the microfabricated sensor during a startup phase, labeled "STARTUP" in FIG. 2A, which may be understood as a transition phase between a non-operation phase, labeled "NON-OPERATION" in FIG. 2A and a subsequent phase of sensing operation of the microfabricated sensor, labeled "SENSING OPERATION" in FIG. 2A. The first heating element and the second heating element are disposed on a sensor cell of the microfabricated sensor, for example as described in reference to FIG. 1. In the chart 200, time is designated on the horizontal axis and power to the first heating element and the second heating element is designated on the vertical axis. A power-time curve for the first heating element is labeled "FIRST HEATING ELEMENT" and a power-time curve for the second heating element is labeled "SECOND HEATING ELEMENT" in FIG. 2A. During an initial period of the startup phase, more power is applied to the first heating element than is applied to the second heating element, so as to develop a temperature gradient in the sensor cell of the microfabricated sensor. The temperature gradient is sufficient to prevent condensation of the sensor fluid on surfaces in a signal path of the microfabricated sensor, for example on surfaces of the first window 112 or the second window 114 of FIG. 1. The sensor fluid may include an alkali metal such as cesium. Work done in pursuit of the instant example has shown a temperature gradient of at least 2° C. is sufficient to prevent condensation of cesium on a glass window. The temperature gradient defines a spot having a minimum temperature outside of the signal path. Later in the startup phase, substantially equal power may be applied to the first heating element and the second heating element, to develop a desired temperature distribution in the sensor cell for a subsequent sensing operation phase. In one version of the instant example, substantially no power may be applied to the second heating element during the initial period of the startup phase, as depicted in FIG. 2A. In one version, full power, that is a power level applied during the sensing operation phase, may be applied to the first heating element during the initial period of the startup phase, as depicted in FIG. 2A. Alternately, partial power may be applied to the second heating element during the initial period of the startup phase, consistent with developing the temperature gradient.

Figure 2B:
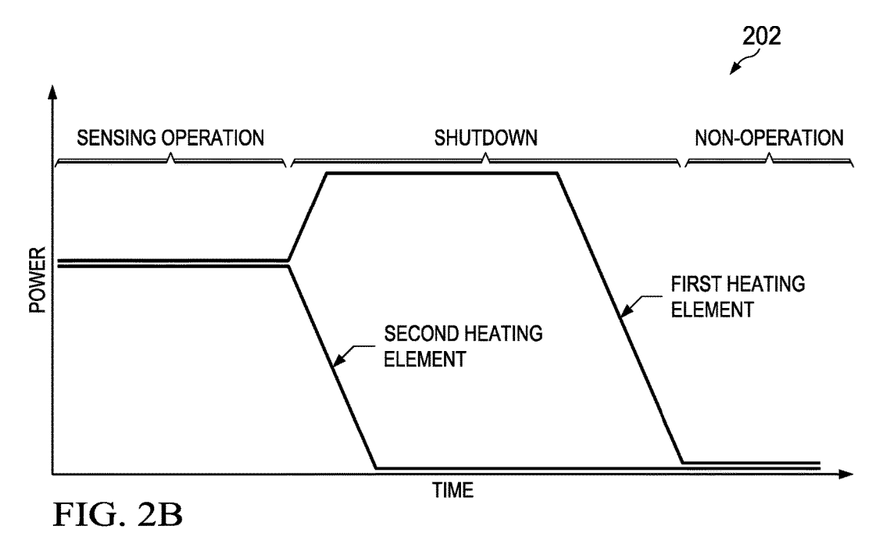

Referring to FIG. 2B, a chart 202 of power applied to the first heating element and the second heating element as a function of time depicts operation of the microfabricated sensor during a shutdown phase, which may be understood as a transition phase between a phase of sensing operation of the microfabricated sensor, labeled "SENSING OPERATION" in FIG. 2B and a subsequent non-operation phase, labeled "NON-OPERATION" in FIG. 2B. A power-time curve for the first heating element is labeled "FIRST HEATING ELEMENT" and a power-time curve for the second heating element is labeled "SECOND HEATING ELEMENT." During an initial period of a shutdown phase, power is maintained or possibly increased to the first heating element while power to the second heating element is ramped down, so as to develop a temperature gradient in the sensor cell of the microfabricated sensor, with the criteria described in reference to FIG. 2A. Later in the shutdown phase, power to the first heating element is ramped down to a non-operation level, which may be zero power. Similarly, power to the second heating element is ramped down to the non-operation level for the subsequent non-operation phase. Various power-time curves for the first heating element and the second heating element during the shutdown phase which develop the temperature gradient preventing condensation of the sensor fluid in the signal path are within the scope of the instant example.

Figure 2C:
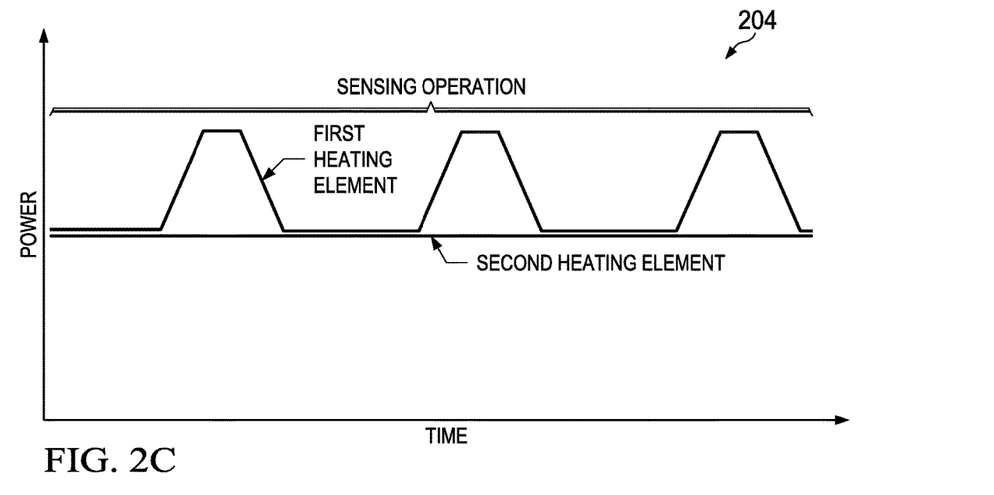

Referring to FIG. 2C, a chart 204 of power applied to the first heating element and the second heating element as a function of time depicts sensing operation of the microfabricated sensor, labeled "SENSING OPERATION" in FIG. 2C. A power-time curve for the first heating element is labeled "FIRST HEATING ELEMENT" and a power-time curve for the second heating element is labeled "SECOND HEATING ELEMENT." In the instant example, more power is temporarily applied to the first heating element than to the second heating element, so as to develop a temperature gradient in the sensor cell of the microfabricated sensor, with the criteria described in reference to FIG. 2A. Subsequently, substantially equal power is applied to the first heating element and to the second heating element. The additional power to the first heating element may be applied with a constant time period, as depicted in FIG. 2C, or may be applied asynchronously, for example using temperature sensing feedback from the sensor cell. Various power-time curves for the first heating element during sensing operation which develop the temperature gradient preventing condensation of the sensor fluid in the signal path are within the scope of the instant example.

Figure 2D:
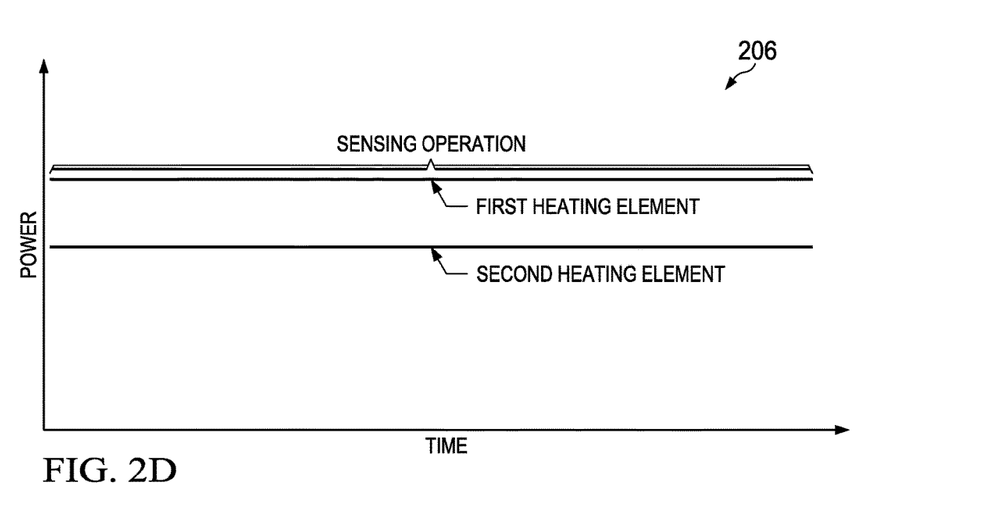

Referring to FIG. 2D, a chart 206 of power applied to the first heating element and the second heating element as a function of time depicts sensing operation of the microfabricated sensor, labeled "SENSING OPERATION" in FIG. 2D. A power-time curve for the first heating element is labeled "FIRST HEATING ELEMENT" and a power-time curve for the second heating element is labeled "SECOND HEATING ELEMENT." In the instant example, more power is constantly applied to the first heating element than to the second heating element, so as to develop a temperature gradient in the sensor cell of the microfabricated sensor, with the criteria described in reference to FIG. 2A. Operation of the microfabricated sensor may include any combination of the methods described in reference to FIG. 2A through FIG. 2D.

Figure 3:
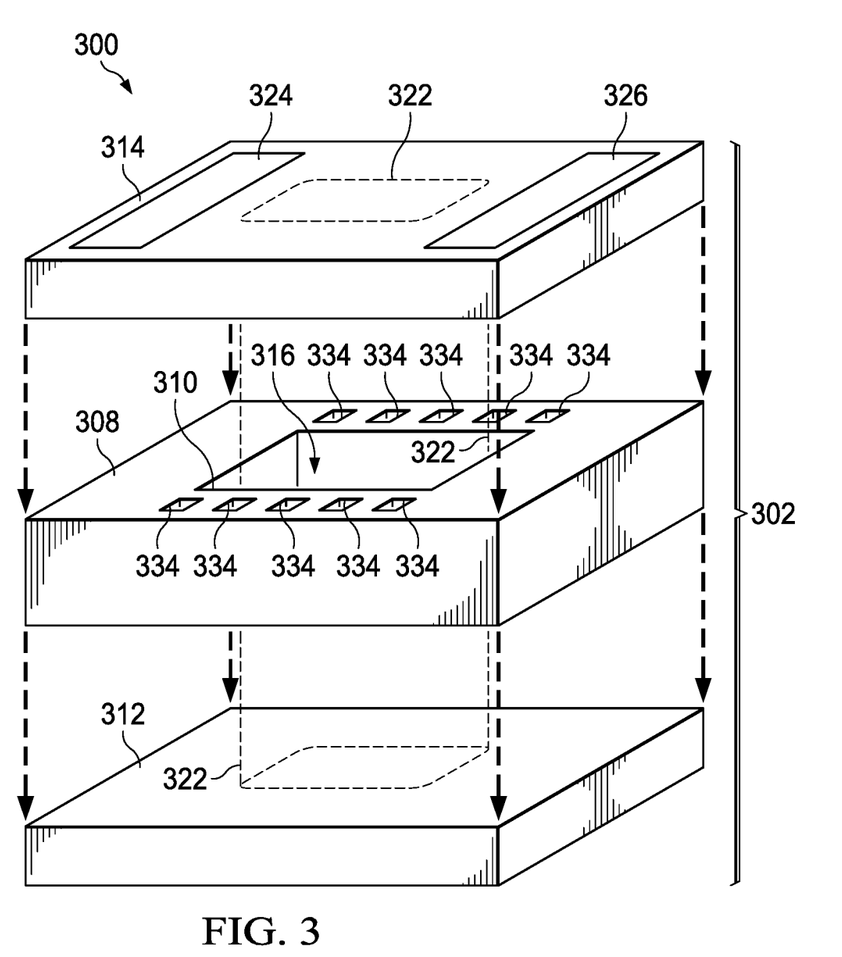
FIG. 3 is an exploded view of another example sensor cell of a microfabricated sensor.

FIG. 3 is an exploded view of another example sensor cell of a microfabricated sensor 300. The sensor cell 302 includes a cell body 308 with an opening 310 through the cell body 308 for a sensor cavity 316. A first window 312 is attached to the cell body 308 across the opening 310, and a second window 314 of the sensor cell 302 is attached to the cell body 308 across the opening 310, on a side of the cell body 308 opposite from the first window 312. The sensor cavity 316 is bounded by the opening 310 through the cell body 308, the first window 312, and the second window 314. A thickness of the cell body 308 between the first window 312 and the second window 314 is less than 10 millimeters and may be 1 millimeter to 2 millimeters, providing the balance described in reference to FIG. 1. Similarly, lateral dimensions of the cell body 308, parallel to the first window 312 and the second window 314, are less than 20 millimeters and may be 8 millimeters to 15 millimeters. A signal path 322 extends through the first window 312, through the sensor cavity 316, and through the second window 314. In the instant example, at least two heating elements, including a first heating element 324 and a second heating element 326 are disposed on the sensor cell 302 on different sides of the sensor cavity 316.

In the instant example, lateral walls of the cell body 308 between the first heating element 324 and the second heating element 326 may be structurally configured to reduce thermal conductivity between the first heating element 324 and the second heating element 326. For example, the lateral walls of the cell body 308 between the first heating element 324 and the second heating element 326 may have holes 334 extending partway through or completely through the cell body 308. The holes 334 may advantageously reduce heat transfer between the first heating element 324 and the second heating element 326 to facilitate development of the desired temperature gradient in the sensor cell 302. In one version of the instant example, the holes 334 may be filled with a material having low thermal conductivity and good mechanical strength, such as aerogel, to provide a desired mechanical integrity of the cell body 308 while having low thermal conductivity between the first heating element 324 and the second heating element 326.

Figure 4:
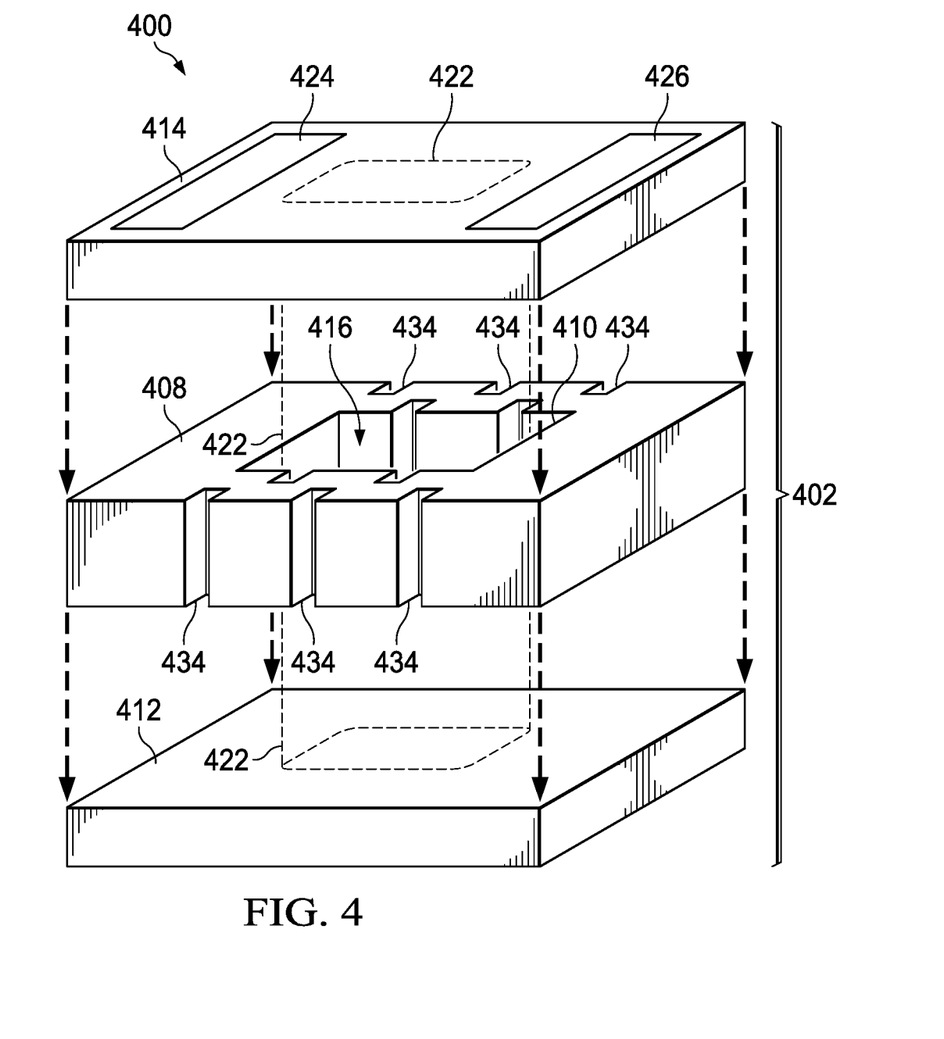
FIG. 4 is an exploded view of a further sensor cell of a microfabricated sensor.

FIG. 4 is an exploded view of a further sensor cell of a microfabricated sensor 400. The sensor cell 402 includes a cell body 408 with an opening 410 through the cell body 408 for a sensor cavity 416. A first window 412 is attached to the cell body 408 across the opening 410, and a second window 414 of the sensor cell 402 is attached to the cell body 408 across the opening 410, on a side of the cell body 408 opposite from the first window 412. The sensor cavity 416 is bounded by the opening 410 through the cell body 408, the first window 412, and the second window 414. A signal path 422 extends through the first window 412, through the sensor cavity 416, and through the second window 414. In the instant example, at least two heating elements, including a first heating element 424 and a second heating element 426 are disposed on the sensor cell 402 on different sides of the sensor cavity 416.

In the instant example, lateral walls of the cell body 408 between the first heating element 424 and the second heating element 426 may be structurally configured to reduce thermal conductivity between the first heating element 424 and the second heating element 426. For example, the lateral walls of the cell body 408 between the first heating element 424 and the second heating element 426 may be reticulated as depicted in FIG. 4, having grooves 434 open to the sensor cavity 416 and/or exterior to the sensor cavity 416, lengthening a heat flow path between the first heating element 424 and the second heating element 426. The reticulated configuration may advantageously reduce heat transfer between the first heating element 424 and the second heating element 426 to facilitate development of the desired temperature gradient in the sensor cell 402. Alternately, the lateral walls of the cell body 408 between the first heating element 424 and the second heating element 426 may be narrow and substantially straight, formed by a wet etch process used to concurrently form the opening 410, advantageously reducing fabrication cost and complexity of the sensor cell 402.

Figure 5:
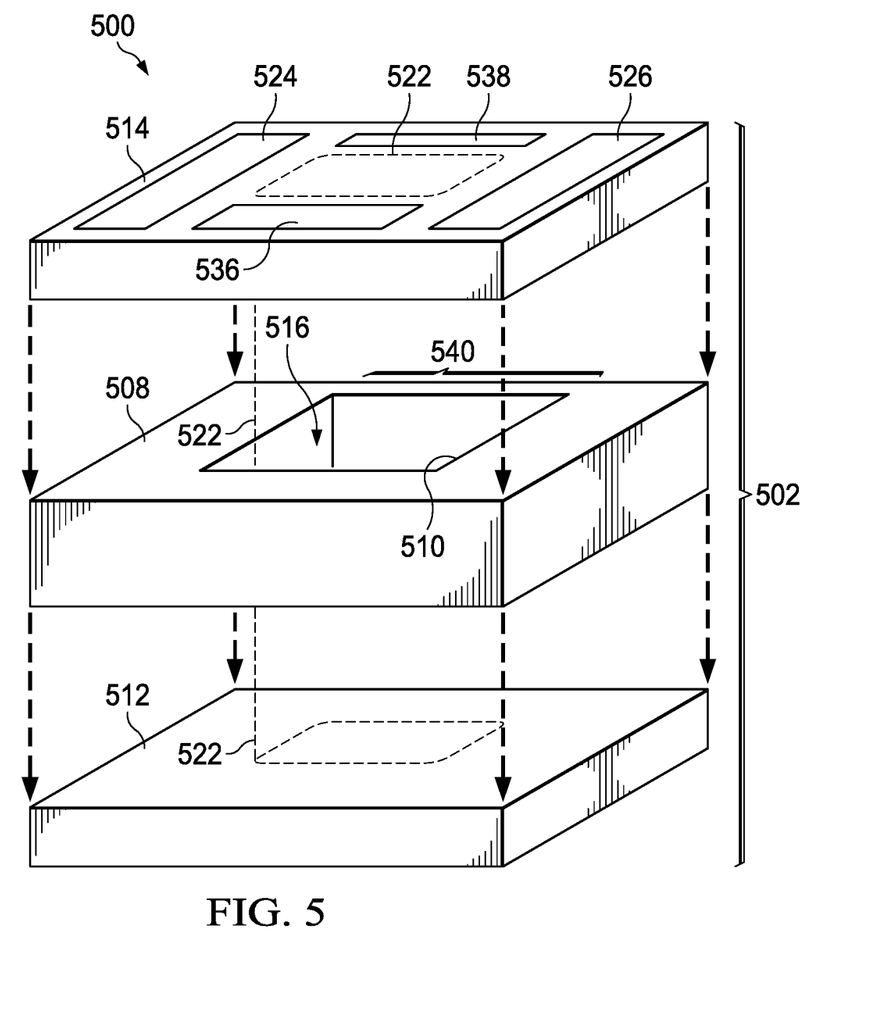
FIG. 5 is an exploded view of an example sensor cell of a microfabricated sensor which has an asymmetric thermal configuration conducive to development of a temperature gradient.

FIG. 5 is an exploded view of an example sensor cell of a microfabricated sensor 500 which has an asymmetric thermal configuration conducive to development of a temperature gradient. The sensor cell 502 includes a cell body 508 with an opening 510 through the cell body 508 for a sensor cavity 516. Sensor fluid and/or sensor fluid material is disposed in the sensor cavity 516. A first window 512 is attached to the cell body 508 across the opening 510, and a second window 514 of the sensor cell 502 is attached to the cell body 508 across the opening 510, on a side of the cell body 508 opposite from the first window 512. The sensor cavity 516 is bounded by the opening 510 through the cell body 508, the first window 512, and the second window 514. A signal path 522 extends through the first window 512, through the sensor cavity 516, and through the second window 514. In the instant example, at least three heating elements, including a first heating element 524, a second heating element 526, and a third heating element 536 are disposed on the sensor cell 502 on three sides of the sensor cavity 516. The first heating element 524 may be disposed opposite from the second heating element 526, as depicted in FIG. 5. An optional fourth heating element 538, which has less power capacity than any of the first heating element 524, the second heating element 526, and the third heating element 536, may be disposed on the sensor cell 502 at a fourth side of the sensor cavity 516. A lateral wall 540 of the cell body 508, located remotely from the first heating element 524, the second heating element 526, and the third heating element 536, may have a higher lateral thermal conductivity and/or lower heat capacity than other lateral walls of the cell body 508.

During operation of the microfabricated sensor 500, power may be applied to the first heating element 524, the second heating element 526, and the third heating element 536, at substantially equal levels, to develop a desired temperature distribution in the sensor cell 502 for providing a desired vapor pressure of the sensor fluid for sensing operation. The asymmetric arrangement of the first heating element 524, the second heating element 526, and the third heating element 536 may develop a temperature gradient with the properties described in reference to FIG. 2A. In the instant example, the temperature gradient defines a spot having a minimum temperature which may be located proximate to the lateral wall 540 of the cell body 508, located remotely from the first heating element 524, the second heating element 526, and the third heating element 536. Power may be applied to the third heating element 536 to enhance the temperature gradient. Power may be applied to the fourth heating element 538, if present, to provide a desired balance between uniformity of the temperature distribution in the sensor cell 502 and sufficient temperature gradient to prevent condensation of the sensor fluid on surfaces in the signal path 522. The temperature gradient may be developed during a startup phase of operation, a sensing phase, and/or a shutdown phase.

Figure 6:
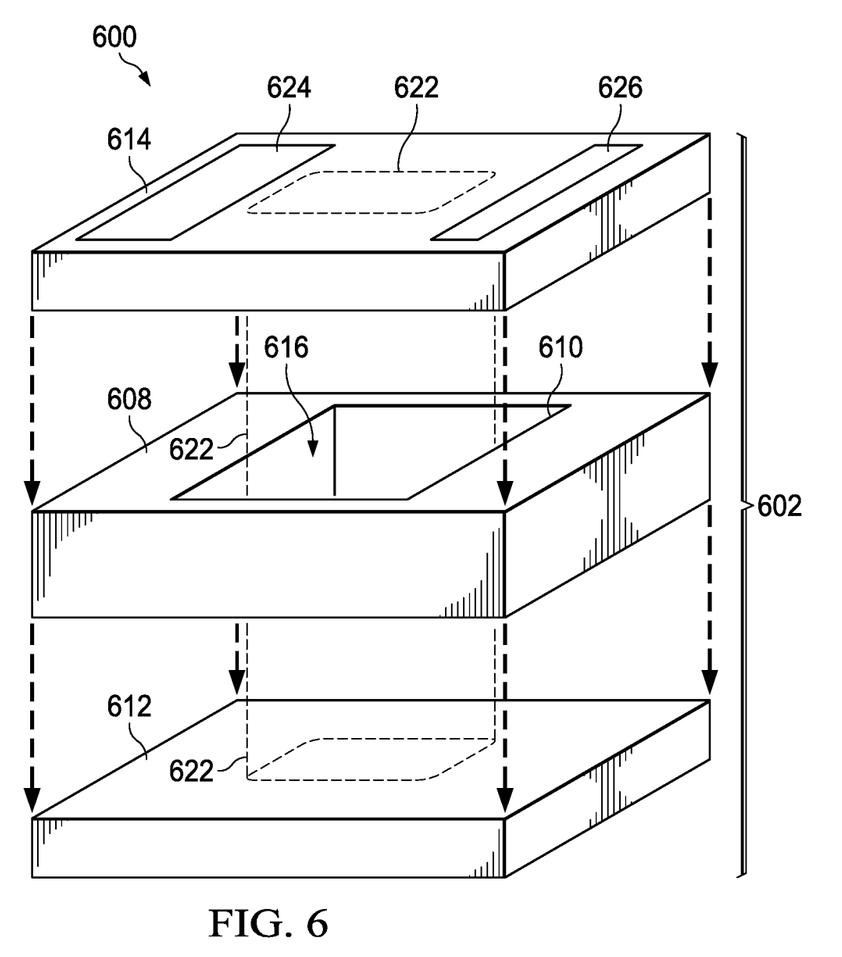
FIG. 6 is an exploded view of another example sensor cell of a microfabricated sensor which has an asymmetric thermal configuration conducive to development of a temperature gradient.

FIG. 6 is an exploded view of another example sensor cell of a microfabricated sensor 600 which has an asymmetric thermal configuration conducive to development of a temperature gradient. The sensor cell 602 includes a cell body 608 with an opening 610 through the cell body 608 for a sensor cavity 616. Sensor fluid and/or sensor fluid material is disposed in the sensor cavity 616. A first window 612 is attached to the cell body 608 across the opening 610, and a second window 614 of the sensor cell 602 is attached to the cell body 608 across the opening 610, on a side of the cell body 608 opposite from the first window 612. The sensor cavity 616 is bounded by the opening 610 through the cell body 608, the first window 612, and the second window 614. A signal path 622 extends through the first window 612, through the sensor cavity 616, and through the second window 614. In the instant example, at least two heating elements, including a first heating element 624 and a second heating element 626 are disposed on the sensor cell 602. The first heating element 624 has a higher power capacity than the second heating element 626, and is disposed opposite from the second heating element 626, as depicted in FIG. 6. The higher power capacity of the first heating element 624 may be manifested, for example, by having a larger area of conductors than the second heating element 626.

During operation of the microfabricated sensor 600, more power may be applied to the first heating element 624 than the second heating element 626, to develop a desired temperature distribution in the sensor cell 602 for providing a desired vapor pressure of the sensor fluid for sensing operation while simultaneously developing a temperature gradient so as to prevent condensation of the sensor fluid on surfaces in the signal path 622. The asymmetric arrangement of the first heating element 624 and the second heating element 626 may facilitate development of the temperature gradient with the properties described in reference to FIG. 2A. In the instant example, the temperature gradient defines a spot having a minimum temperature which may be located proximate to the second heating element 626. Power applied to the first heating element 624 and the second heating element 626 may be adjusted during operation to provide a desired balance between the temperature distribution and the temperature gradient. The temperature gradient may be developed during a startup phase, a sensing phase and/or a shutdown phase.

Figure 7:
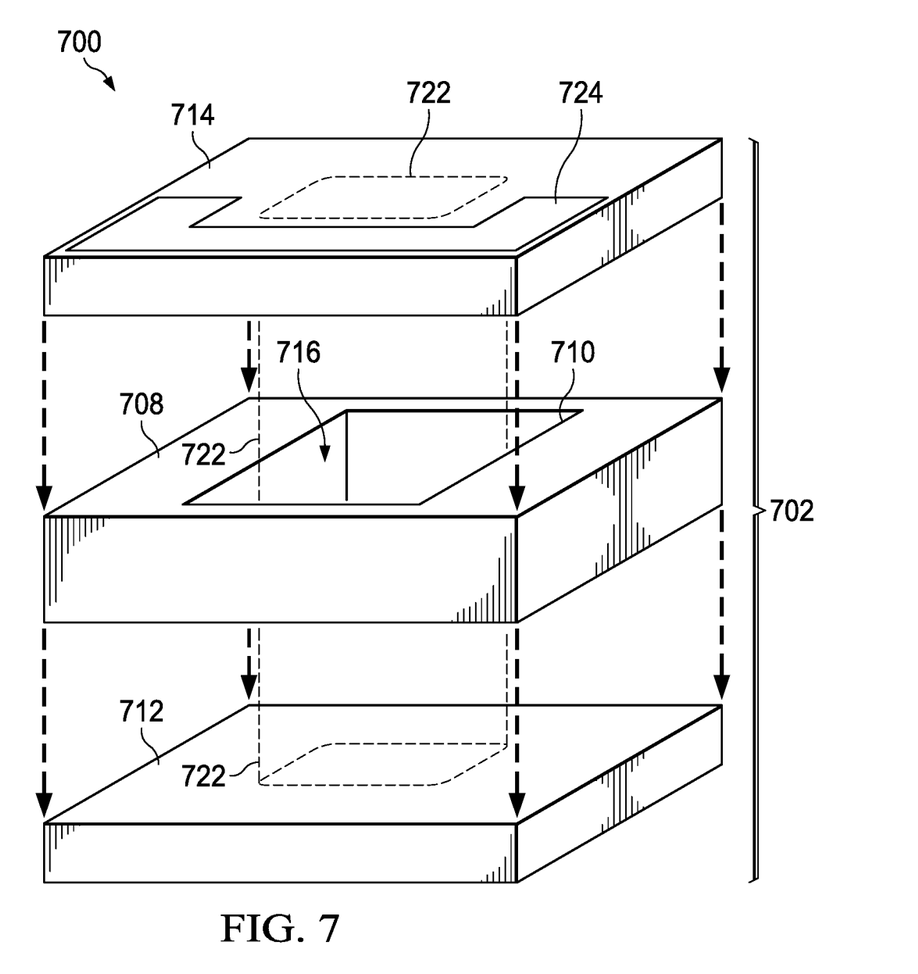
FIG. 7 is an exploded view of another example sensor cell of a microfabricated sensor which has an asymmetric thermal configuration conducive to development of a temperature gradient.

FIG. 7 is an exploded view of another example sensor cell of a microfabricated sensor 700 which has an asymmetric thermal configuration conducive to development of a temperature gradient. The sensor cell 702 includes a cell body 708 with an opening 710 through the cell body 708 for a sensor cavity 716. Sensor fluid and/or sensor fluid material is disposed in the sensor cavity 716. A first window 712 is attached to the cell body 708 across the opening 710, and a second window 714 of the sensor cell 702 is attached to the cell body 708 across the opening 710, on a side of the cell body 708 opposite from the first window 712. The sensor cavity 716 is bounded by the opening 710 through the cell body 708, the first window 712, and the second window 714. A signal path 722 extends through the first window 712, through the sensor cavity 716, and through the second window 714. In the instant example, a heating element 724 is disposed on the sensor cell 702, extending along three sides of the sensor cavity 716. A fourth side of the sensor cavity 716 is free of a heating element.

During operation of the microfabricated sensor 700, power is applied to the heating element 724 to develop a desired temperature distribution in the sensor cell 702 for providing a desired vapor pressure of the sensor fluid for sensing operation. The asymmetric configuration of the heating element 724 with respect to the sensor cavity 716 may simultaneously develop a temperature gradient so as to prevent condensation of the sensor fluid on surfaces in the signal path 722. In the instant example, the temperature gradient defines a spot having a minimum temperature which may be located proximate to the fourth side of the sensor cavity 716 which is free of a heating element. The temperature gradient may be developed during a startup phase, a sensing phase and/or a shutdown phase.

Figure 8:
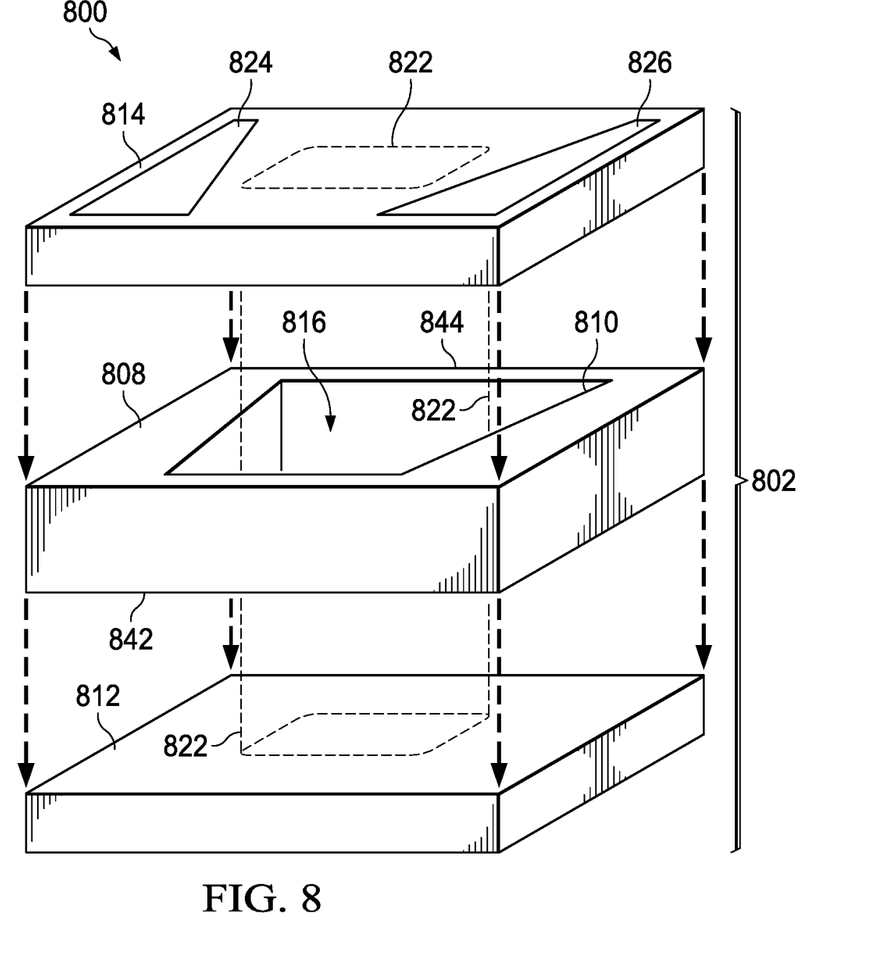
FIG. 8 is an exploded view of another example sensor cell of a microfabricated sensor which has an asymmetric thermal configuration conducive to development of a temperature gradient.

FIG. 8 is an exploded view of another example sensor cell of a microfabricated sensor 800 which has an asymmetric thermal configuration conducive to development of a temperature gradient. The sensor cell 802 includes a cell body 808 with an opening 810 through the cell body 808 for a sensor cavity 816. Sensor fluid and/or sensor fluid material is disposed in the sensor cavity 816. A first window 812 is attached to the cell body 808 across the opening 810, and a second window 814 of the sensor cell 802 is attached to the cell body 808 across the opening 810, on a side of the cell body 808 opposite from the first window 812. The sensor cavity 816 is bounded by the opening 810 through the cell body 808, the first window 812, and the second window 814. A signal path 822 extends through the first window 812, through the sensor cavity 816, and through the second window 814. In the instant example, two heating elements, including a first heating element 824 and a second heating element 826 are disposed on the sensor cell 802 on opposite sides of the sensor cavity 816, as depicted in FIG. 8. The first heating element 824 and the second heating element 826 have asymmetric shapes configured to provide more heat to a first side 842 of the cell body 808, located between the first heating element 824 and the second heating element 826, and less heat to a second side 844 of the cell body 808 which is opposite from the first side 842. The first heating element 824 and the second heating element 826 may have substantially equal power capacities. The opening 810 through the cell body 808 for the sensor cavity 816 may have a trapezoidal shape to accommodate the asymmetric shapes of the first heating element 824 and the second heating element 826. The trapezoidal shape may enhance development of the temperature gradient by having lower thermal conduction from the first heating element 824 and the second heating element 826 to the second side 844 of the cell body 808.

During operation of the microfabricated sensor 800, power may be applied substantially equally to the first heating element 824 and the second heating element 826, to develop a desired temperature distribution in the sensor cell 802 for providing a desired vapor pressure of the sensor fluid for sensing operation while simultaneously developing a temperature gradient so as to prevent condensation of the sensor fluid on surfaces in the signal path 822. The asymmetric arrangement of the first heating element 824 and the second heating element 826 may facilitate development of the temperature gradient with the properties described in reference to FIG. 2A. In the instant example, the temperature gradient defines a spot having a minimum temperature which may be located proximate to the second side 844 of the cell body 808. The temperature gradient may be developed during a startup phase, a sensing phase and/or a shutdown phase.

Figure 9:
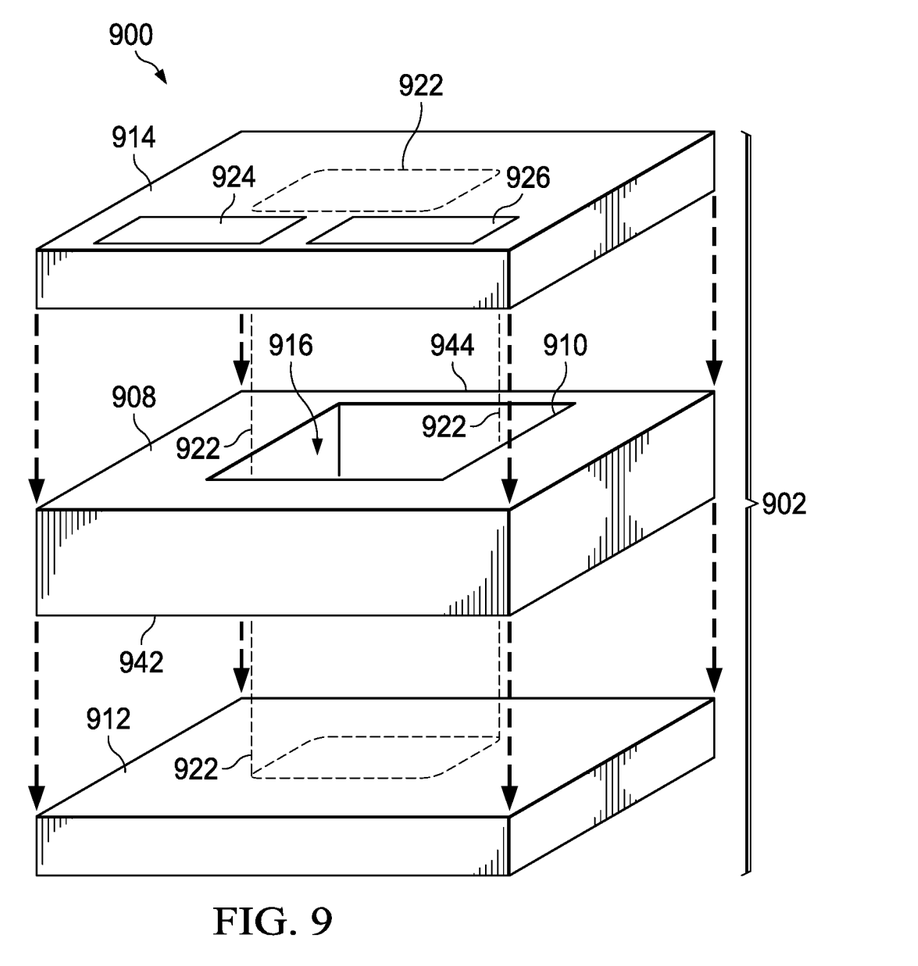
FIG. 9 is an exploded view of another example sensor cell of a microfabricated sensor which has an asymmetric thermal configuration conducive to development of a temperature gradient.

FIG. 9 is an exploded view of another example sensor cell of a microfabricated sensor which has an asymmetric thermal configuration conducive to development of a temperature gradient. The sensor cell 902 includes a cell body 908 with an opening 910 through the cell body 908 for a sensor cavity 916. A first window 912 is attached to the cell body 908 across the opening 910, and a second window 914 of the sensor cell 902 is attached to the cell body 908 across the opening 910, on a side of the cell body 908 opposite from the first window 912. The sensor cavity 916 is bounded by the opening 910 through the cell body 908, the first window 912, and the second window 914. Sensor fluid and/or sensor fluid material is disposed in the sensor cavity 916. A signal path 922 extends through the first window 912, through the sensor cavity 916, and through the second window 914. In the instant example, two heating elements, including a first heating element 924 and a second heating element 926 are disposed on the sensor cell 902 on a same side of the sensor cavity 916, as depicted in FIG. 9. The first heating element 924 and the second heating element 926 have an asymmetric configuration with respect to the sensor cavity 916 to provide more heat to a first side 942 of the cell body 908, located immediately proximate to the first heating element 924 and the second heating element 926, and less heat to a second side 944 of the cell body 908 which is opposite from the first side 942. The first heating element 924 and the second heating element 926 may have substantially equal power capacities. The opening 910 through the cell body 908 for the sensor cavity 916 may be laterally offset from a center of the cell body 908 to accommodate the asymmetric configuration of the first heating element 924 and the second heating element 926. The lateral offset of the sensor cavity 916 may enhance development of the temperature gradient by reducing a thermal mass at the second side 944 of the cell body 908.

During operation of the microfabricated sensor 900, power may be applied substantially equally to the first heating element 924 and the second heating element 926, to develop a desired temperature distribution in the sensor cell 902 for providing a desired vapor pressure of the sensor fluid for sensing operation while simultaneously developing a temperature gradient so as to prevent condensation of the sensor fluid on surfaces in the signal path 922. The asymmetric arrangement of the first heating element 924 and the second heating element 926 may facilitate development of the temperature gradient with the properties described in reference to FIG. 2A. In the instant example, the temperature gradient defines a spot having a minimum temperature which may be located proximate to the second side 944 of the cell body 908. Alternatively, more power may be applied to the first heating element 924 than to the second heating element 926 to increase the temperature gradient. The temperature gradient may be developed during a startup phase, a sensing phase and/or a shutdown phase.

Figure 10:
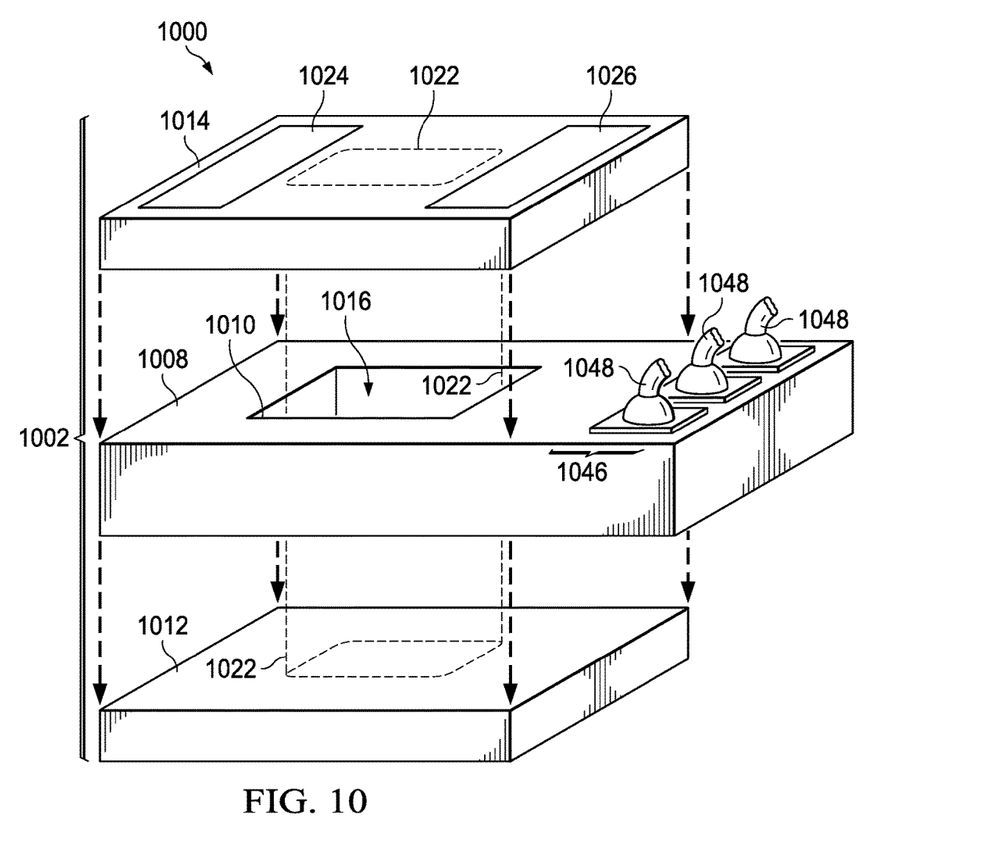
FIG. 10 is an exploded view of a further example sensor cell of a microfabricated sensor which has an asymmetric thermal configuration conducive to development of a temperature gradient.

FIG. 10 is an exploded view of a further example sensor cell of a microfabricated sensor 1000 which has an asymmetric thermal configuration conducive to development of a temperature gradient. The sensor cell 1002 includes a cell body 1008 with an opening 1010 through the cell body 1008 for a sensor cavity 1016. Sensor fluid and/or sensor fluid material is disposed in the sensor cavity 1016. A first window 1012 is attached to the cell body 1008 across the opening 1010, and a second window 1014 of the sensor cell 1002 is attached to the cell body 1008 across the opening 1010, on a side of the cell body 1008 opposite from the first window 1012. The sensor cavity 1016 is bounded by the opening 1010 through the cell body 1008, the first window 1012, and the second window 1014. A signal path 1022 extends through the first window 1012, through the sensor cavity 1016, and through the second window 1014. In the instant example, two heating elements, including a first heating element 1024 and a second heating element 1026 are disposed on the sensor cell 1002 on opposite sides of the sensor cavity 1016, as depicted in FIG. 10. Alternately, the first heating element 1024 and the second heating element 1026 may have any of the configurations disclosed herein. In the instant example, the cell body 1008 has a body extension 1046 that extends beyond the first window 1012 and the second window 1014. The body extension 1046 may be located on a side of the cell body 1008 immediately proximate to the second heating element 1026, as depicted in FIG. 10. Other arrangements of the body extension 1046 with respect to the first heating element 1024 and the second heating element 1026 are within the scope of the instant example. Thermal connections 1048 to a package frame or other structural member of the microfabricated sensor 1000 may be disposed on the body extension 1046. The thermal connections 1048 may be, for example, wire bonds as depicted in FIG. 10. The body extension 1046 and thermal connections 1048 are configured to remove heat from the cell body 1008 asymmetrically, so as to develop a temperature gradient when power is applied to the first heating element 1024 and the second heating element 1026. In an alternate manifestation of the instant example, the thermal connections 1048 may include fluid lines which remove heat using fluid transport, providing a more effective heat removal. In a further manifestation of the instant example, the first window 1012 and/or the second window 1014 may include an extension analogous to the body extension 1046 for the same purpose of developing the temperature gradient.

During operation of the microfabricated sensor 1000, more power may be applied to the first heating element 1024 than the second heating element 1026, to simultaneously develop a desired temperature distribution in the sensor cell 1002 for providing a desired vapor pressure of the sensor fluid for sensing operation and to develop a temperature gradient to prevent condensation of the sensor fluid in the signal path 1022. The body extension 1046 and thermal connections 1048 remove a portion of the heat from the cell body 1008 asymmetrically, so as to enhance the temperature gradient. In the instant example, the temperature gradient defines a spot having a minimum temperature which may be located proximate to body extension 1046. The temperature gradient may be developed during a startup phase, a sensing phase and/or a shutdown phase.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A sensor, comprising:
a sensor cell having a cavity;
an alkali metal disposed in the cavity; and
a heating element disposed adjacent the cavity;
wherein:
an optical signal path extends through the cavity; and
the sensor cell has a thermal configuration conducive to development of a temperature gradient in the cavity in the event that power is applied to the heating element, wherein the temperature gradient defines a location having a minimum temperature which is out of the optical signal path.

2. The sensor of claim 1, wherein the thermal configuration comprises an asymmetric configuration of the heating element with respect to the cavity.

3. The sensor of claim 1, wherein the sensor cell has a first heating element disposed on the sensor cell and a second heating element disposed on the sensor cell, and wherein the thermal configuration comprises an asymmetric configuration of the first heating element and the second heating element with respect to the cavity.

4. The sensor of claim 3, wherein the first heating element has a larger area of conductors than the second heating element.

5. The sensor of claim 1, wherein the sensor cell has a first heating element disposed on the sensor cell, a second heating element disposed on the sensor cell, and a third heating element disposed on the sensor cell, the second heating element being disposed on the sensor cell opposite from the first heating element with respect to the sensor cavity, and wherein the thermal configuration comprises an asymmetric configuration of the third heating element with respect to the sensor cavity.

6. The sensor of claim 1, wherein the thermal configuration comprises an asymmetric shape of the cavity with respect to the heating element.

7. The sensor of claim 1, wherein the thermal configuration comprises a lateral wall of a cell body of the sensor cell between the first heating element and the second heating element which is structurally configured to reduce thermal conductivity between the first heating element and the second heating element.

8. The sensor of claim 1, further comprising a cell body having an opening defining the cavity and a window attached to the cell body, wherein the thermal configuration comprises a body extension of the cell body on a side of the cavity with thermal connections to a structural member of the sensor.

9. The sensor of claim 1, wherein the signal path is free of heating elements.

10. A method, comprising:
forming a cavity within a sensor cell;
locating an alkali metal in the cavity; and
disposing a heating element on the sensor cell adjacent the cavity,
wherein:
an optical signal path extends through the cavity;
the sensor cell has a thermal configuration conducive to development of a temperature gradient across the cavity on the condition that power is applied to the first heating element, wherein the temperature gradient defines a spot having a minimum temperature which is out of the optical signal path.

11. The method of claim 10, wherein the thermal configuration comprises an asymmetric configuration of the heating element with respect to the sensor cavity.

12. The method of claim 10, wherein the heating element is a first heating element, and the sensor cell has a second heating element disposed on the sensor cell, wherein the thermal configuration comprises an asymmetric configuration of the first heating element and the second heating element with respect to the sensor cavity.

13. The method of claim 12, wherein the first heating element has a larger area of conductors than the second heating element.

14. The method of claim 10, wherein the thermal configuration comprises an asymmetric shape of the sensor cavity with respect to the heating element.

15. The method of claim 10, wherein the heating element is a first heating element, and the sensor cell has a second heating element disposed on the sensor cell, the second heating element being disposed on the sensor cell opposite from the first heating element with respect to the sensor cavity, and further comprising forming a lateral wall of a cell body of the sensor cell between the first heating element and the second heating element which is structurally configured to reduce thermal conductivity between the first heating element and the second heating element.

16. The method of claim 10, further comprising forming within the sensor cell a cell body having an opening defining the sensor cavity and a window attached to the cell body, wherein the thermal configuration comprises a body extension of the cell body on a side of the sensor cavity with thermal connections to a structural member of the sensor.

17. The method claim 10, further comprising:
configuring a signal emitter to transmit a signal through the sensor cell; and
configuring a signal detector to receive the signal after the signal passes through the sensor cell.

18. A sensor, comprising:
a sensor cell having a sensor cavity located in the sensor cell;
a sensor fluid material disposed in the sensor cavity;
first, second and third heating elements disposed on the sensor cell;
a signal emitter disposed outside the sensor cell; and
a signal detector disposed outside the sensor cell;
wherein:
a signal path extends from the signal emitter through the sensor cavity to the signal detector; and
the sensor cell has a thermal configuration conducive to development of a temperature gradient in the sensor cell in the event that power is applied to the first heating element, wherein the temperature gradient defines a location having a minimum temperature which is out of the signal path within the sensor cell; and
wherein the second heating element is disposed opposite from the first heating element with respect to the cavity, and the thermal configuration comprises an asymmetric configuration of the third heating element with respect to the cavity.

19. The sensor of claim 18, wherein the sensor fluid material comprises an alkali metal.

20. The sensor of claim 18, further comprising a fourth heating element disposed opposite the third heating element with respect to the cavity, the third heating element having a larger area of conductors than the fourth heating element.

* * * * *